United States Patent
Lee et al.

(10) Patent No.: US 9,589,619 B2
(45) Date of Patent: Mar. 7, 2017

(54) SPIN-ORBIT-TORQUE MAGNETORESISTIVE RANDOM ACCESS MEMORY WITH VOLTAGE-CONTROLLED ANISOTROPY

(71) Applicant: QUALCOMM Incorporated, San Diego, CA (US)

(72) Inventors: Kangho Lee, San Diego, CA (US); Jimmy Kan, San Diego, CA (US); Seung Hyuk Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/617,919

(22) Filed: Feb. 9, 2015

(65) Prior Publication Data

US 2016/0232959 A1   Aug. 11, 2016

(51) Int. Cl.
  *G11C 11/00*  (2006.01)
  *G11C 11/16*  (2006.01)
  (Continued)

(52) U.S. Cl.
  CPC ........ *G11C 11/1675* (2013.01); *G11C 11/161* (2013.01); *G11C 11/1673* (2013.01);
  (Continued)

(58) Field of Classification Search
  CPC ..... H01L 43/08; H01L 27/222; H01L 27/226; H01L 43/06; H01L 45/146;
  (Continued)

(56) References Cited

U.S. PATENT DOCUMENTS 8,350,347 B2   1/2013   Gaudin et al.
8,384,171 B2   2/2013   Gaudin et al.
(Continued)

FOREIGN PATENT DOCUMENTS

WO   2012159078 A2   11/2012
WO   2013025994 A2   2/2013
WO   2014025838 A1   2/2014

OTHER PUBLICATIONS

Braganca P.M., et al., "A Three-Terminal Approach to Developing Spin-Torque Written Magnetic Random Access Memory Cells," IEEE Transactions on Nanotechnology, Mar. 2009, vol. 8, No. 2, pp. 190-195.

(Continued)

*Primary Examiner* — Son Dinh
*Assistant Examiner* — Uyen B Tran
(74) *Attorney, Agent, or Firm* — Muncy, Geissler, Olds & Lowe, P.C.

(57) ABSTRACT

Methods and apparatus relating to spin-orbit-torque magnetoresistive random access memory with voltage-controlled anisotropy are disclosed. In an example, disclosed is a three-terminal magnetic tunnel junction (MTJ) storage element that is programmed via a combination of voltage-controlled magnetic anisotropy (VCMA) and spin-orbit torque (SOT) techniques. Also disclosed is a memory controller configured to program the three-terminal MTJ storage element via VCMA and SOT techniques. The disclosed devices improve efficiency over conventional devices by using less write energy, while having a design that is simpler and more scalable than conventional devices. The disclosed devices also have increased thermal stability without increasing required switching current, as critical switching current between states is essentially the same.

21 Claims, 8 Drawing Sheets

(51) Int. Cl.
*G11C 11/18* (2006.01)
*H01L 43/02* (2006.01)
*H01L 43/08* (2006.01)
*H01L 43/10* (2006.01)
*H01L 43/12* (2006.01)
*G11C 8/00* (2006.01)

(52) U.S. Cl.
CPC .............. *G11C 11/18* (2013.01); *H01L 43/02* (2013.01); *H01L 43/08* (2013.01); *H01L 43/10* (2013.01); *H01L 43/12* (2013.01); *G11C 8/005* (2013.01)

(58) Field of Classification Search
CPC ............. H01L 27/2436; H01L 27/2463; G11C 11/161; G11C 11/16; G11C 13/0007; G11C 11/5607; G11C 11/18
See application file for complete search history.

(56) References Cited

U.S. PATENT DOCUMENTS

| | | | | |
|---|---|---|---|---|
| 8,416,618 B2* | 4/2013 | Gaudin | ................... | G11C 11/16 365/148 |
| 9,105,830 B2* | 8/2015 | Khvalkovskiy | ......... | H01L 43/02 |
| 2006/0118839 A1* | 6/2006 | Sugahara | ............... | B82Y 10/00 257/295 |
| 2011/0141796 A1* | 6/2011 | Lee | ......................... | H01L 43/10 365/158 |
| 2014/0124882 A1* | 5/2014 | Khalili Amiri | ......... | H01L 43/08 257/421 |
| 2014/0169088 A1 | 6/2014 | Buhrman et al. | | |
| 2015/0200003 A1* | 7/2015 | Buhrman | ................ | G11C 11/18 365/158 |
| 2016/0267961 A1 | 9/2016 | Lee et al. | | |

OTHER PUBLICATIONS

International Search Report and Written Opinion—PCT/US2016/013542 ISA/EPO—Apr. 22, 2016.
Liu, L, et al., "Spin Torque Switching with the Giant Spin Hall Effect of Tantalum," Science, vol. 336, No. 6081, 2012, pp. 555-558.
Wang W-G., et al., "Electric-Field-Assisted Switching in Magnetic Tunnel Junctions", Nature Materials, 2012, vol. 11, pp. 64-68. Retrieved from Internet: http://www.nature.com/nmat/journal/v11/n1/full/nmat3171.html.

* cited by examiner

600

605

In a three-terminal spin-orbit-torque magnetoresistive memory having a magnetoresistive tunnel junction (MTJ) including a free layer located between an oxide barrier layer and a substantially planar spin hall-effect material, apply a first voltage across the MTJ to reduce a magnetic anisotropy of the free layer by inducing an electric field across the oxide barrier layer.

610

Apply a second voltage across the substantially planar spin hall-effect material to cause a current to flow through the substantially planar spin hall-effect material and thereby apply a spin-orbit torque to the free layer, thus causing the free layer to switch between a parallel state and an antiparallel state

*FIG. 6A*

SPIN-ORBIT-TORQUE MAGNETORESISTIVE RANDOM ACCESS MEMORY WITH VOLTAGE-CONTROLLED ANISOTROPY

INTRODUCTION

This disclosure relates generally to electronics, and more specifically, but not exclusively, to methods and apparatus relating to spin-orbit-torque magnetoresistive random access memory with voltage-controlled anisotropy.

Random access memory (RAM) is a ubiquitous component of modern digital circuit architectures. RAM can be a standalone device, or can be integrated in a device that uses the RAM, such as a microprocessor, microcontroller, application specific integrated circuit (ASIC), system-on-chip (SoC), and other like devices. RAM can be volatile or non-volatile. Volatile RAM loses its stored information whenever power is removed. Non-volatile RAM can maintain its memory contents even when power is removed.

Magnetoresistive Random Access Memory (MRAM) is a non-volatile memory technology having response (read and write) times comparable to volatile memory. Data stored in MRAM does not degrade over time and, compared to other RAM technologies, MRAM uses very little power. In contrast with conventional RAM technologies, which store data as electric charges or current flows, MRAM uses magnetic storage elements. Thus, MRAM has several desirable characteristics that make it a candidate for a universal memory, such as high speed, high density (i.e., small bitcell size), low power consumption, and no logic state degradation over time.

Despite the characteristics described above, conventional MRAM devices are not perfect. A conventional memory element (e.g., a magnetic tunnel junction (MTJ)) in a spin-transfer-torque MRAM (e.g., a STT-MRAM) is a two-terminal device having shared read and write paths. The shared read and write paths create problems for read speed and write reliability. For writing, the barrier layer in the MTJ should be sufficiently thin (and have relatively low enough resistance) to flow a current necessary for switching. However, a thin barrier layer is more susceptible to dielectric breakdown due to repeated write operations. Also, a state of an MTJ can be flipped unintentionally by a read current. This is called a "read disturbance." As MTJ technology scales down in physical size, switching current tends to decrease. However, high-speed read operations typically require more read current. Therefore, high-speed MRAM, and particularly deeply-scaled MTJ devices, may suffer from a read disturbance, Accordingly, it is challenging to meet reliability requirements for both write endurance (due to strain on a tunnel barrier in the MTJ) and read reliability.

Further, switching current asymmetry in conventional bottom-pinned two-terminal MTJ devices is incompatible with conventional N-type metal-oxide-semiconductor (NMOS) drive transistors. A critical switching current ($I_c$) asymmetry effect is present in conventional bottom-pinned two-terminal MTJ devices because spin-torque is more efficient in an antiparallel to parallel (AP→P) direction than in a parallel to antiparallel (P→AP) direction, so $I_{c0AP \to P} < I_{c0P \to AP}$. Thus, spin torque efficiency is asymmetric in the conventional bottom-pinned two-terminal MTJ devices, and depends on an angle between relative magnetization vectors and polarization. Further, a driving power of a write transistor coupled in series with a conventional bottom-pinned two-terminal MTJ device also has asymmetry that is not compatible with writing $I_c$ asymmetry of the conventional bottom-pinned two-terminal MTJ devices. This leads to wasted energy during a write process, complicated MRAM and MTJ devices, read disturbances, and write endurance problems.

Accordingly, there are long-felt industry needs for methods and apparatus that improve upon conventional methods and apparatus, including the improved methods and apparatus provided hereby.

SUMMARY

This summary provides a basic understanding of some aspects of the present teachings. This summary is not exhaustive in detail, and is neither intended to identify all critical features, nor intended to limit the scope of the claims.

Exemplary methods and apparatus for writing data to a three-terminal spin-orbit-torque magnetoresistive memory having a magnetoresistive tunnel junction (MTJ) including a free layer located between an oxide barrier layer and a substantially planar spin hall-effect material are provided. An exemplary method includes applying a first voltage across the MTJ to reduce a magnetic anisotropy of the free layer by inducing an electric field across the oxide barrier layer, as well as applying a second voltage across the substantially planar spin hall-effect material to cause a current to flow through the substantially planar spin hall-effect material and thereby apply a spin-orbit torque to the free layer, thus causing the free layer to switch between a parallel state and an antiparallel state. The electric field can be induced in a manner that reduces the magnetic anisotropy of the free layer from a naturally-occurring anisotropy of the free layer. The decreased magnetic anisotropy of the free layer can reduce a switching current of the MTJ.

In a further example, provided is a non-transitory computer-readable medium, comprising instructions stored thereon that, if executed by a processor, such as a special-purpose processor, cause the processor to execute at least a part of the aforementioned method. The non-transitory computer-readable medium can be integrated with a device, such as a mobile device, a music player, a video player, an entertainment unit, a navigation device, a communications device, a personal digital assistant, a fixed location data unit, and/or a computer.

In another example, provided is an apparatus including a memory controller configured to write data to a three-terminal spin-orbit-torque magnetoresistive memory having a magnetoresistive tunnel junction (MTJ) including a free layer located between an oxide barrier layer and a substantially planar spin hall-effect material. The memory controller can include means for applying a first voltage across the MTJ to reduce a magnetic anisotropy of the free layer by inducing an electric field across the oxide barrier layer, as well as means for applying a second voltage across the substantially planar spin hall-effect material to cause a current to flow through the substantially planar spin hall-effect material and thereby apply a spin-orbit torque to the free layer, thus causing the free layer to switch between a parallel state and an antiparallel state. The electric field can be induced in a manner that reduces the magnetic anisotropy of the free layer from a naturally-occurring anisotropy of the free layer. The reducing the magnetic anisotropy of the free layer can reduces a switching current of the MTJ. In an example, the means for applying the first voltage across the MTJ includes means for applying the voltage between the substantially planar spin hall-effect material and an MTJ electrode.

At least a part of the apparatus (for example, the means for applying the voltage across the MTJ) can be integrated in a semiconductor die. Further, at least a part of the apparatus (for example, the means for applying the voltage across the MTJ) can be a part of a device, such as a mobile device, a set top box, a music player, a video player, an entertainment unit, a navigation device, a communications device, a personal digital assistant, a fixed location data unit, and/or a computer. In a further example, provided is a non-transitory computer-readable medium, comprising instructions stored thereon that, if executed by a lithographic device, cause the lithographic device to fabricate at least a part of the apparatus.

In another example, provided is an apparatus including a memory controller configured to write data to a three-terminal spin-orbit-torque magnetoresistive memory having a magnetoresistive tunnel junction (MTJ) including a free layer located between an oxide barrier layer and a substantially planar spin hall-effect material. The memory controller is configured to apply a first voltage across the MTJ to reduce a magnetic anisotropy of the free layer by inducing an electric field across the oxide barrier layer. The memory controller is also configured to apply a second voltage across the substantially planar spin hall-effect material to cause a current to flow through the substantially planar spin hall-effect material and thereby apply a spin-orbit torque to the free layer, thus causing the free layer to switch between a parallel state and an antiparallel state. The memory controller can be configured to induce the electric field in a manner that reduces the magnetic anisotropy of the free layer from a naturally-occurring anisotropy of the free layer. The reducing the magnetic anisotropy of the free layer can reduce a switching current of the MTJ. The memory controller can be configured to apply the first voltage across the MTJ between the substantially planar spin hall-effect material and an MTJ electrode.

At least a part of the apparatus (for example, the memory controller) can be integrated on a semiconductor die. Further, at least a part of the apparatus can include a device, such as a mobile device, a base station, a set top box, a music player, a video player, an entertainment unit, a navigation device, a communications device, a personal digital assistant, a fixed location data unit, and/or a computer, with another part of the apparatus (for example, the memory controller) being a constituent part of the device. In an example, the memory controller is integrated with at least one of a base station or a mobile device. In a further example, provided is a non-transitory computer-readable medium, comprising instructions stored thereon that, if executed by a lithographic device, cause the lithographic device to fabricate at least a part of the apparatus.

The foregoing broadly outlines some of the features and technical advantages of the present teachings in order that the detailed description and drawings can be better understood. Additional features and advantages are also described in the detailed description. The conception and disclosed examples can be readily utilized as a basis for modifying or designing other structures for carrying out the same purposes of the present teachings. Such equivalent constructions do not depart from the technology of the teachings as set forth in the claims. The inventive features that are characteristic of the teachings, together with further objects and advantages, are better understood from the detailed description and the accompanying figures. Each of the figures is provided for the purpose of illustration and description only, and does not limit the present teachings.

BRIEF DESCRIPTION OF THE DRAWINGS

The accompanying drawings are presented to describe examples of the present teachings, and are not limiting.

FIG. 6A depicts an exemplary method for writing data to a three-terminal spin-orbit-torque magnetoresistive read only memory.

Figure 1:
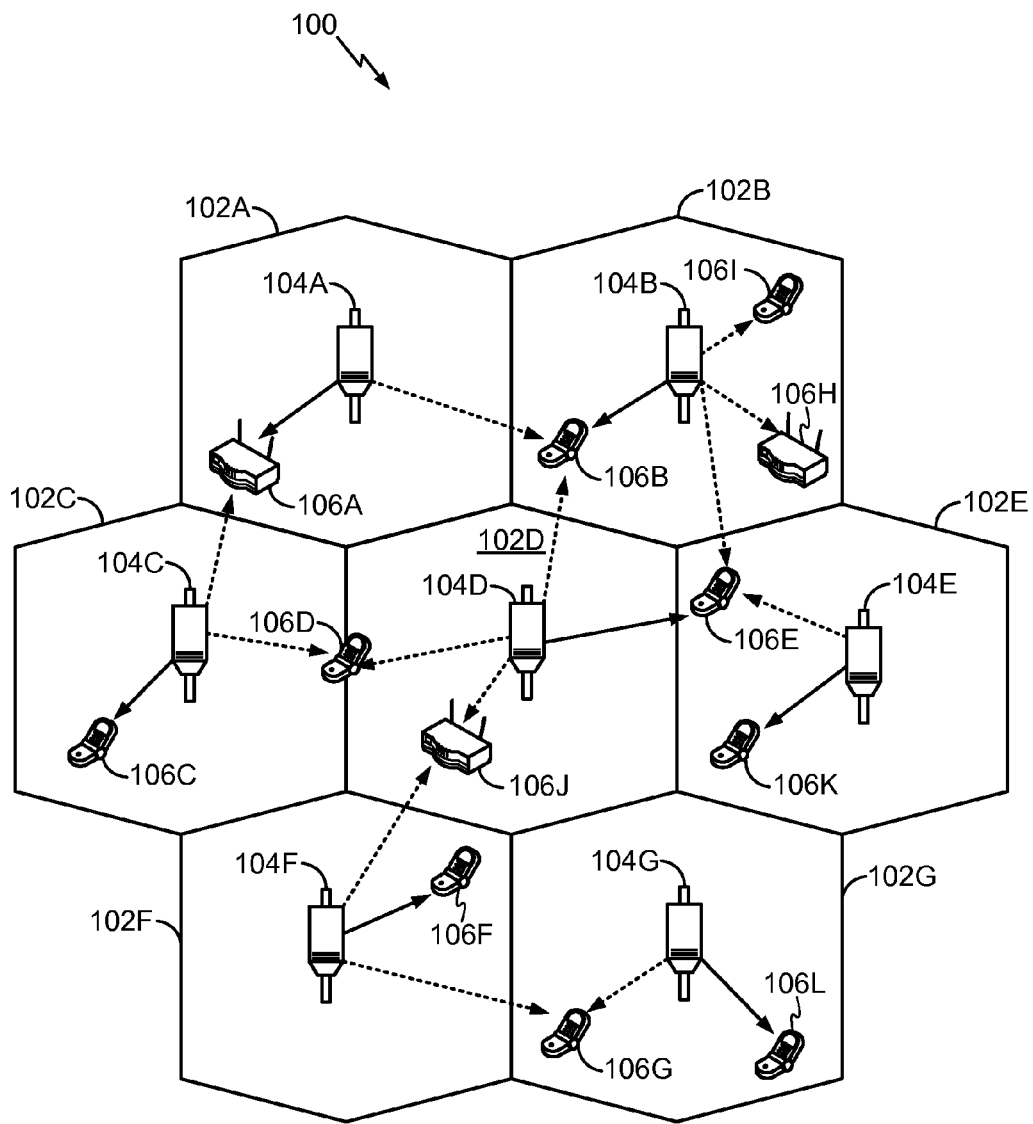
FIG. 1 depicts an exemplary wireless communication network.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Introduction

Methods and apparatus relating to spin-orbit-torque magnetoresistive random access memory with voltage-controlled anisotropy are provided. In an example, disclosed is a 3-terminal magnetic tunnel junction (MTJ) storage element that is programmed via a combination of voltage-controlled magnetic anisotropy (VCMA) and spin-orbit torque (SOT) techniques.

The exemplary apparatuses and methods disclosed herein advantageously address the long-felt industry needs, as well as other previously unidentified needs, and mitigate shortcomings of the conventional methods and apparatus. For example, an advantage provided by the disclosed apparatuses and methods herein is an improvement in efficiency over conventional devices. The disclosed devices also use less write energy, while having a design that is simpler and more scalable than conventional devices. The disclosed devices also have increased thermal stability without increasing required switching current, as critical switching current between states (e.g., antiparallel to parallel, parallel to antiparallel) is essential the same. Other important advantages include that the disclosed devices do not trigger read disturbances, do not have write endurance problems, and do not have data retention problems. Furthermore, at least one of the provided devices is easy to fabricate. Moreover, the $I_c$ asymmetry effect is not present in the provided spin-orbit torque techniques. A further advantage of the disclosed devices and techniques is that writing a logic one and writing a logic zero requires essentially the same amount of energy.

Examples are disclosed in this application's text and drawings. Alternate examples can be devised without departing from the scope of the examples. Additionally, conventional elements of the current teachings may not be described in detail, or may be omitted, to avoid obscuring aspects of the current teachings.

As used herein, the term "exemplary" means "serving as an example, instance, or illustration." Any example described as "exemplary" is not necessarily to be construed as preferred or advantageous over other examples. Likewise, the term "examples" does not require that all examples include the discussed feature, advantage, or mode of operation. Use of the terms "in one example," "an example," "in one feature," and/or "a feature" in this specification does not necessarily refer to the same feature and/or example. Furthermore, a particular feature and/or structure can be combined with one or more other features and/or structures. Moreover, at least a portion of the apparatus described hereby can be configured to perform at least a portion of a method described hereby.

It should be noted that the terms "connected," "coupled," or any variant thereof, mean any connection or coupling, either direct or indirect, between elements, and can encompass a presence of an intermediate element between two elements that are "connected" or "coupled" together via the intermediate element. Coupling and/or connection between the elements can be physical, logical, or a combination thereof. As employed herein, elements can be "connected" or "coupled" together, for example, by using one or more wires, cables, and/or printed electrical connections, as well as by using electromagnetic energy. The electromagnetic energy can have wavelengths in the radio frequency region, the microwave region and/or the optical (both visible and invisible) region. These are several non-limiting and non-exhaustive examples.

It should be understood that the term "signal" can include any signal such as a data signal, audio signal, video signal, multimedia signal, analog signal, and/or digital signal. Information and signals can be represented using any of a variety of different technologies and techniques. For example, data, an instruction, a process block, a command, information, a signal, a bit, and/or a symbol described in this description can be represented by a voltage, a current, an electromagnetic wave, a magnetic field and/or particle, an optical field and/or particle, and any combination thereof.

Any reference herein to an element using a designation such as "first," "second," and so forth does not limit the quantity and/or order of those elements. Rather, these designations are used as a convenient method of distinguishing between two or more elements and/or instances of an element. Thus, a reference to first and second elements does not mean that only two elements can be employed, or that the first element must necessarily precede the second element. Also, unless stated otherwise, a set of elements can comprise one or more elements. In addition, terminology of the form "at least one of: A, B, or C" used in the description or the claims can be interpreted as "A or B or C or any combination of these elements."

The terminology used herein is for the purpose of describing particular examples only and is not intended to be limiting. As used herein, the singular forms "a," "an," and "the" are intended to include the plural forms as well, unless the context clearly indicates otherwise. Further, the terms "comprises," "comprising," "includes," and "including," when used herein, specify a presence of stated features, integers, steps, operations, elements, and/or components, but do not preclude the presence and/or addition of one or more other features, integers, steps, operations, elements, components, and/or groups thereof.

The provided apparatuses can be a part of and/or coupled to, an electronic device having a memory, such as, but not limited to, a mobile device, a mobile telephone, a wireless device, a personal data assistant, a hand-held computer, a portable computer, a GPS receiver, a navigation device, a camera, an audio player, a camcorder, a game console, a watch, a clock, a calculator, a television, a flat panel display, a computer monitor, an auto display (e.g., an odometer display, etc.), a cockpit control and/or display, a display coupled to a camera (e.g., a rear and/or side view camera in a vehicle), an electronic photograph frame, an electronic billboard, an electronic sign, and/or a projector.

The term "mobile device" can describe, and is not limited to, a mobile phone, a mobile communication device, a pager, a personal digital assistant, a personal information manager, a mobile hand-held computer, a portable computer, a wireless device, a wireless modem, and/or other types of portable electronic devices typically carried by a person and having communication capabilities (e.g., wireless, cellular, infrared, short-range radio, etc.). Further, the terms "user equipment" (UE), "mobile terminal," "mobile device," and "wireless device" can be interchangeable.

DESCRIPTION OF THE FIGURES

FIG. 1 depicts an exemplary wireless communication network 100 to demonstrate principles of multiple access communication. The wireless communication network 100 is configured to support communication between multiple users. As shown, the wireless communication network 100 can be divided into one or more cells 102A-102G. Communication coverage in cells 102A-102G can be provided by one or more access points 104A-104G. Thus, each of the access points 104A-104G can provide communication coverage to a corresponding cell 102A-102G. The access points 104A-104G can interact with at least one user device in a plurality of user devices 106A-106L.

Each user device 106A-106L can communicate with one or more of the access points 104A-104G on a downlink (DL) and/or an uplink (UL). In general, a DL is a communication link from an access point to a user device, while an UL is a communication link from a user device to an access point. The access points 104A-104G can be coupled via wired or wireless interfaces, allowing the access points 104A-104G to communicate with each other and/or other network equipment. Accordingly, each user device 106A-106L can also communicate with another user device 106A-106L via one or more of the access points 104A-104G. For example, the user device 106J can communicate with the user device 106H in the following manner: the user device 106J can communicate with the access point 104D, the access point 104D can communicate with the access point 104B, and the access point 104B can communicate with the user device 106H, allowing communication to be established between the user device 106J and the user device 106H.

The wireless communication network 100 can provide service over a large geographic region, a small geographic region, and any size region having a size in between the large geographic region and the small geographic region. For example, the cells 102A-102G can cover a few blocks within a neighborhood or several square miles in a rural environment. In some systems, each of the cells 102A-102G can be further divided into one or more sectors (not shown). In addition, the access points 104A-104G can provide the user devices 106A-106L within their respective coverage areas (i.e., respective cells 102A-102G) with access to other communication networks, such as at least one of the Internet, a cellular network, a private network, or the like. In the example shown in FIG. 1, the user devices 106A, 106H, and 106J comprise routers, while the user devices 106B-106G, 106I, 106K, and 106L comprise mobile phones. However, each of the user devices 106A-106L can comprise any suitable communication device.

At least a portion of the apparatus and methods disclosed herein can be implemented in at least one of the access points 104A-104G or the user devices 106A-106L. Further, examples of the disclosure can be suitably employed in a device which includes Magnetoresistive Random Access Memory (MRAM) memory.

Figure 2:
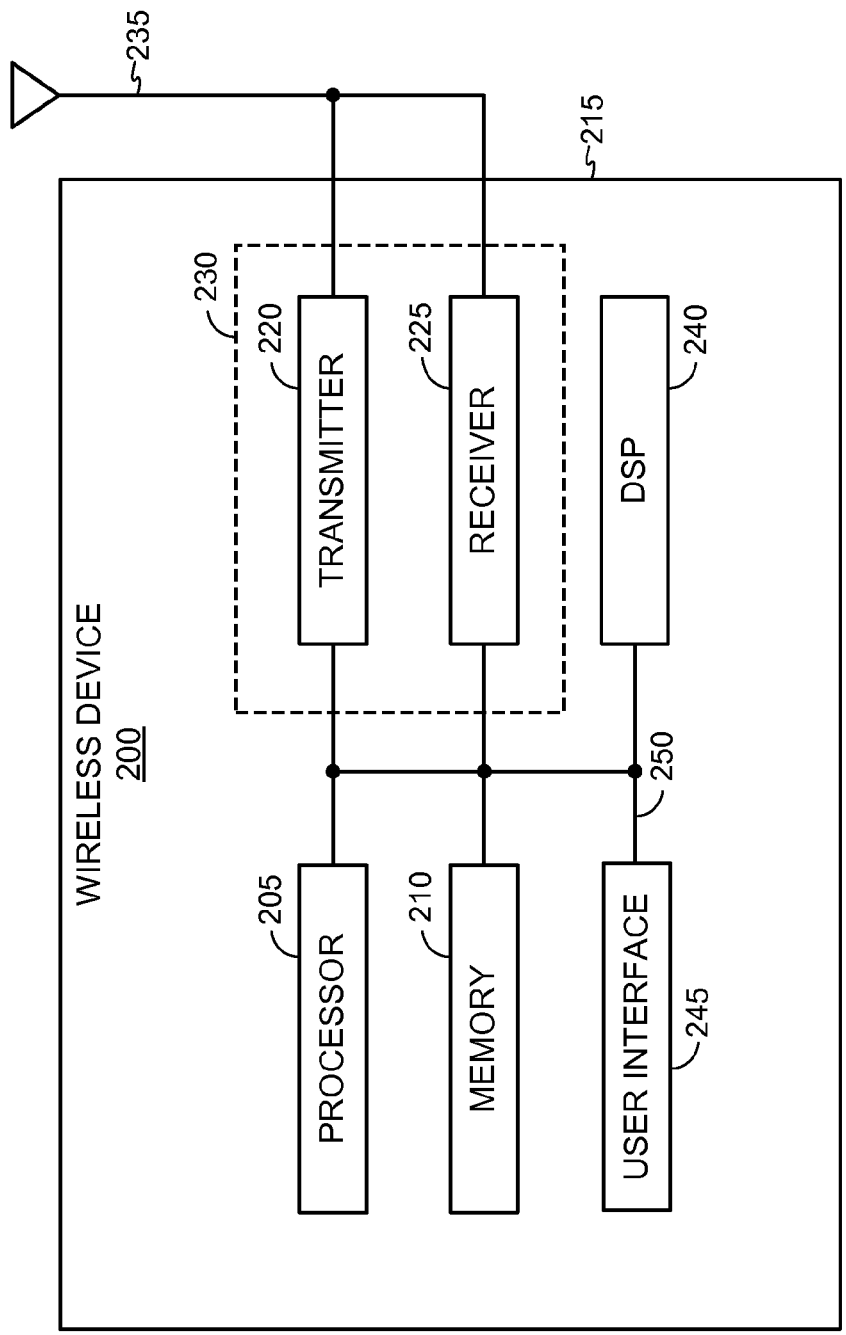
FIG. 2 depicts a functional block diagram of an exemplary user device.

FIG. 2 depicts an exemplary functional block diagram of an exemplary user device 200, which can correspond to at least one of the user devices 106A-106L. FIG. 2 also depicts different components that can be implemented in the user device 200. The user device 200 is an example of a device that can be configured to include the apparatus described hereby.

The user device 200 can include a processor 205 which is configured to control operation of the user device 200, including performing at least a part of a method described hereby. The processor 205 can also be referred to as a central processing unit (CPU) and as a special-purpose processor. A memory 210, which can include at least one of read-only memory (ROM) or random access memory (RAM) (e.g., an MRAM) provides instructions and data to the processor 205. In an example, the processor 205 can include a memory controller that is configured to perform at least a part of a method described hereby. In an example, the processor 205 can be coupled to a memory controller that is configured to perform at least a part of a method described hereby. In an example, the processor 205 can be a memory controller. The processor 205 can perform logical and arithmetic operations based on program instructions stored within the memory 210. The instructions in the memory 210 can be executable to implement at least a part of a method described hereby.

The processor 205 can comprise or be a component of a processing system implemented with one or more processors. The one or more processors can be implemented with a microprocessor, a microcontroller, a digital signal processor (DSP), a field programmable gate array (FPGA), a programmable logic device (PLD), a controller, a state machine, gated logic, a discrete hardware component, a dedicated hardware finite state machine, and/or any other suitable entity that can calculate and/or manipulate information.

The processing system can also include a non-transitory machine-readable media (e.g., the memory 210) that stores software. Software can mean any type of instructions, whether referred to as software, firmware, middleware, microcode, hardware description language, and/or otherwise. Instructions can include code (e.g., in source code format, binary code format, executable code format, or any other suitable format of code). The instructions, when executed by the processor 205, can transform the processor 205 into a special-purpose processor that causes the processor to perform a function described hereby.

The user device 200 can also include a housing 215, a transmitter 220, and a receiver 225 to allow transmission and reception of data between the user device 200 and a remote location. The transmitter 220 and receiver 225 can be combined into a transceiver 230. An antenna 235 can be attached to the housing 225 and electrically coupled to the transceiver 230. The user device 200 can also include (not shown) multiple transmitters, multiple receivers, multiple transceivers, and/or multiple antennas.

The user device 200 can further comprise a digital signal processor (DSP) 240 that is configured to process data. The user device 200 can also further comprise a user interface 245. The user interface 245 can comprise a keypad, a microphone, a speaker, and/or a display. The user interface 245 can include any element and/or component that conveys information to a user of the user device 200 and/or receives input from the user.

The various components of the user device 200 can be coupled together by a bus system 250. The bus system 250 can include a data bus, for example, as well as a power bus, a control signal bus, and/or a status signal bus in addition to the data bus. The components of the user device 200 can be coupled together to accept or provide inputs to each other using a different suitable mechanism.

Figure 3:
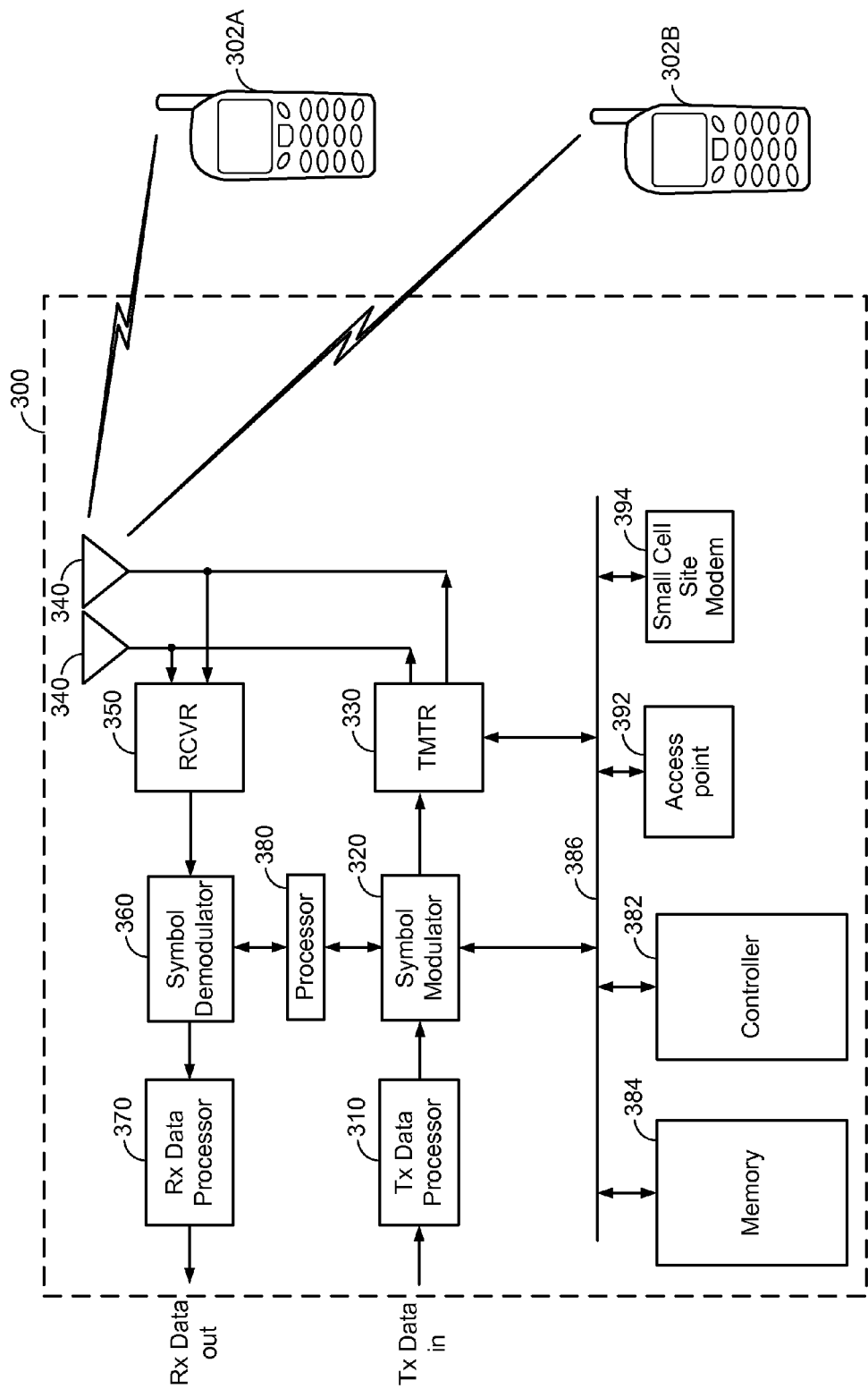
FIG. 3 depicts a functional block diagram of an exemplary access point.

FIG. 3 depicts an exemplary access point 300. The access point 300 can correspond to any of the access points 104A-104G. As shown, the access point 300 includes a TX data processor 310, symbol modulator 320, transmitter unit (TMTR) 330, antenna(s) 340, receiver unit (RCVR) 350, symbol demodulator 360, RX data processor 370, and configuration information processor 380, performing various operations for communicating with one or more user devices 302A-302B. The user devices 302A-302B can correspond to at least one user device in a plurality of user devices 106A-106L. The access point 300 can also include a controller 382 and a memory 384 configured to store related data or instructions. Together, via a bus 386, these units can perform special-purpose processing in accordance with the appropriate radio technology or technologies used for communication, as well as other functions for the access point 300.

The controller 382 is configured to control operation of the access point 300. The controller 382 can also be referred to as a central processing unit (CPU) and as a special-purpose processor. In an example, the controller 382 can include a memory controller that is configured to perform at least a part of a method described hereby. In an example, the controller 382 can be coupled to a memory controller that is configured to perform at least a part of a method described hereby. In an example, the controller 382 can be a memory controller. The memory 384, which can include at least one of read-only memory (ROM) or random access memory (RAM) (e.g., an MRAM) provides instructions and data to the controller 382. The controller 382 can perform logical and arithmetic operations based on program instructions stored within the memory 384. The instructions in the memory 384 can be executable to implement at least a part of a method described hereby.

The controller 382 can comprise or be a component of a processing system implemented with one or more processors. The one or more processors can be implemented with a microprocessor, a microcontroller, a digital signal processor (DSP), a field programmable gate array (FPGA), a programmable logic device (PLD), a controller, a state machine, gated logic, a discrete hardware component, a dedicated hardware finite state machine, and/or any other suitable entity that can calculate and/or manipulate information.

The processing system can also include a non-transitory machine-readable media (e.g., the memory 384) that stores software. Software can mean any type of instructions, whether referred to as software, firmware, middleware, microcode, hardware description language, and/or otherwise. Instructions can include code (e.g., in source code format, binary code format, executable code format, or any other suitable format of code). The instructions, when executed by the controller 382, can transform the controller 382 into a special-purpose processor that causes the processor to perform a function described hereby.

The access point 300 can include at least one of a wireless local area network (WLAN) air interface (e.g., in accordance with an IEEE 802.11x protocol) or a cellular air interface (e.g., in accordance with an LTE protocol). As shown, the access point 300 includes an 802.11x access point (AP) 392 co-located with a small site modem 394, such as a femtocell station modem (FSM). The functionality of one or more of these components can be integrated directly into, or otherwise performed by, the controller 382 of the access point 300, sometimes in conjunction with the memory 384. The access point 300 can communicate with the user devices 302A-302B via the AP 392 and/or the FSM 394. A single user device (e.g., the user device 302A) can communicate with the access point 300 via both the AP 392 and the FSM 394, either simultaneously or at different times.

In general, the AP 392 can provide an air interface (e.g., in accordance with an IEEE 802.11x protocol) over an unlicensed portion of the wireless spectrum such as an industrial, scientific, and medical (ISM) radio band, whereas the FSM 394 can provide an air interface (e.g., in accordance with an LTE protocol) over a licensed portion of the wireless band reserved for cellular communications. However, the FSM 394 can also be configured to provide cellular (e.g., LTE) connectivity over an unlicensed portion of the wireless spectrum. This type of unlicensed cellular operation can include the use of an anchor licensed carrier operating in a licensed portion of the wireless spectrum (e.g., LTE Supplemental DownLink (SDL)) and an unlicensed portion of the wireless spectrum (e.g., LTE, LTE Advanced in unlicensed spectrum), or can be a standalone configuration operating without using an anchor licensed carrier (e.g., LTE Standalone).

Figure 4A:
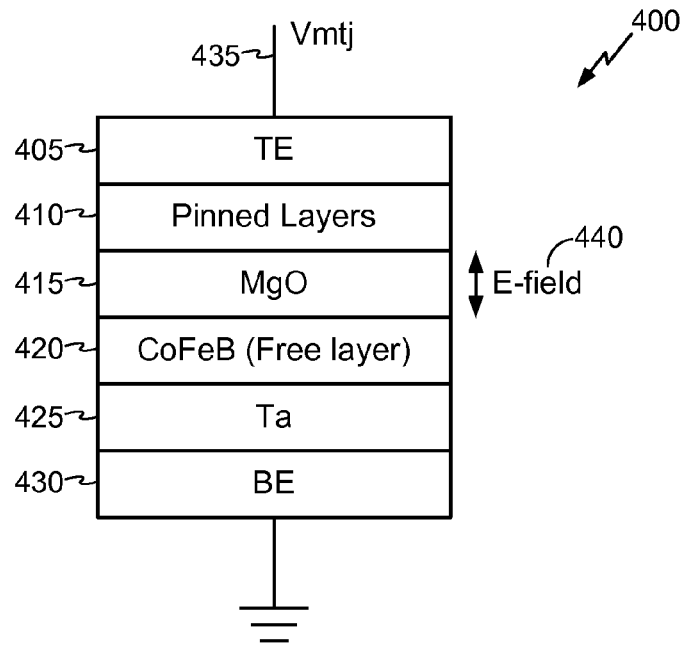
FIG. 4A depicts an exemplary magnetoresistive tunnel junction having a voltage controlled magnetic anisotropy.

FIG. 4A depicts an exemplary magnetoresistive tunnel junction (MTJ) 400 having a voltage controlled magnetic anisotropy (VCMA). VCMA is an interface effect that is caused by an increase or decrease of electron density at an interface of two materials. The electron density can be modified by applying a voltage across the two materials, thus causing an electric field to either raise or lower the interface electron density. A spin-density of in-plane d-orbitals (interface spins) is directly correlated to the electron density and can be controlled by the magnitude of the applied voltage.

Figure 5A:
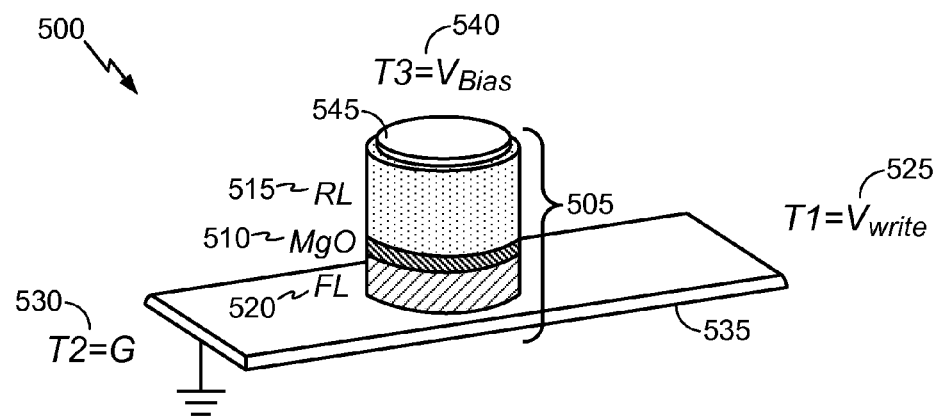
FIG. 5A depicts an exemplary write operation in which a logic one is written to a three-terminal spin-orbit-torque (SOT) magnetoresistive read only memory (MRAM).
Figure 5B:
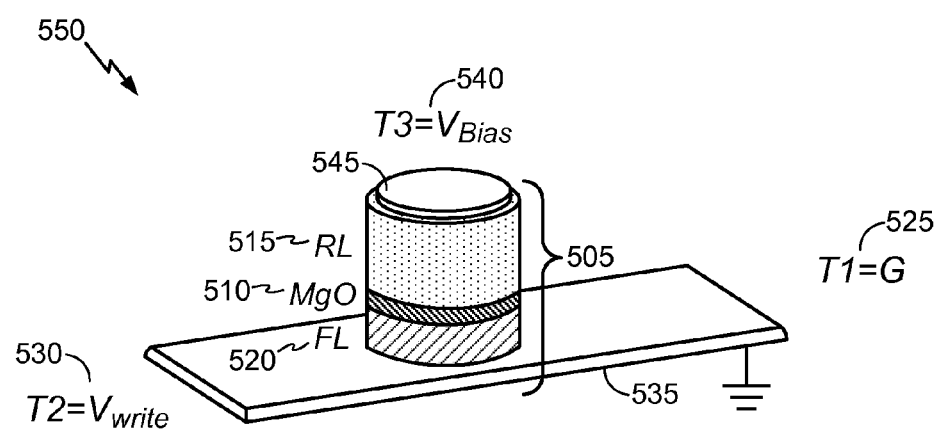
FIG. 5B depicts an exemplary write operation in which a logic zero is written to the three-terminal SOT-MRAM.
Figure 5C:
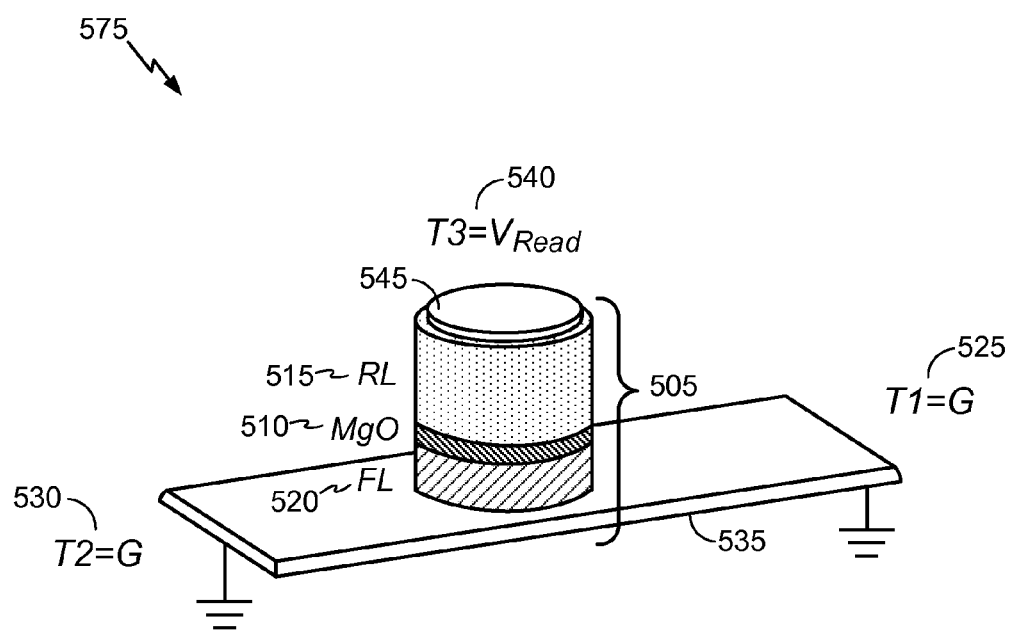
FIG. 5C depicts an exemplary read operation in which a state of the three-terminal SOT-MRAM is read.

The MTJ 400 can be an integral part of the MTJ 505 of FIGS. 5A-5C. The MTJ 400 includes a top electrode (TE) 405, a reference layer (e.g., a pinned layer) 410, a barrier layer 415, a free layer 420, a metal layer 425, and a bottom electrode (BE) 430. The top electrode 405 can be formed of at least one of Ta or Ru. The reference layer 410 can be formed of at least one of Fe, Co, CoFe, or CoFeB. The barrier layer 415 can be formed of MgO. The free layer 420 can be formed of at least one of Fe, Co, CoFe, or CoFeB. The metal layer 425 can be formed of Ta. The bottom electrode 430 can be formed of at least one of Ta or Ru.

A magnetic anisotropy of the free layer 420 can be manipulated (e.g., varied) by applying a voltage (Vmtj) 435 across the barrier layer 415 via the top electrode 405 and the bottom electrode 430. The resultant electric field 440 affects the magnetic anisotropy of the free layer 420, thereby providing a VCMA and modifying a required current to switch the magnetic state (parallel or antiparallel) of the free layer 420. Equation One shows the effect of reducing the anisotropy field ($H_k$) of the free layer 420 on reducing the threshold current density ($J_c$):

$$H'_{demag} = 4\pi M_s - \frac{2K_u(V)}{M_s} \rightarrow |J_c| \propto \lambda\left(H_k + \frac{H'_{demag}}{2}\right)$$

Equation One where $H'_{demag}$ is the material and shape dependent field affiliated with the shape anisotropy; $M_s$ is a saturation magnetization; $K_u$ is a voltage-dependent magnetic anisotropy of the free layer; and V is an applied voltage (e.g., Vmtj 435). The magnitude of the magnetic anisotropy of the free layer 420 depends on the magnitude of the applied voltage (Vmtj) 435 across the barrier layer 420. However, the effect of the applied voltage (Vmtj) 435 is not sufficient to switch the magnetic state (parallel or antiparallel) of the free layer 420. Applying the voltage can transition the system from an in-plane to perpendicular anisotropy (or vice versa), but upon removing the voltage, a deterministic switching of the free layer magnetization cannot be achieved (M+ or M−). In an example, a proposed device uses a combination of VCMA and assistance from spin-hall effect (or spin orbit torque) in order to ensure a preferential magnetization direction.

Figure 4B:
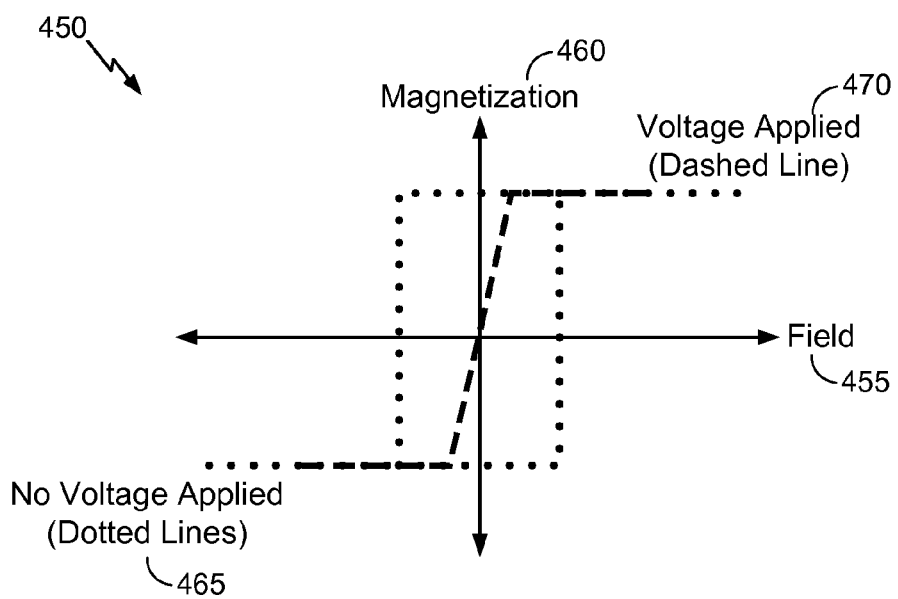
FIG. 4B depicts an exemplary graph of the anisotropic-dependency of an applied magnetic field necessary to switch a state of an magnetoresistive tunnel junction's free layer.

FIG. 4B depicts an exemplary graph 450 of the anisotropic-dependency of an applied magnetic field 455 necessary to switch a state of the free layer (i.e., magnetization 460). As shown in FIG. 4B, as the applied voltage (e.g., Vmtj 435) increases from zero 465 to a non-zero magnitude 470, the applied magnetic field 455 necessary to switch a state of the free layer is reduced.

FIG. 5A depicts a write operation in which a logic one is written to a three-terminal spin-orbit-torque (SOT) MRAM 500 having a magnetoresistive tunnel junction (MTJ) 505.

The SOT-MRAM 500 includes a magnesium oxide barrier layer 510 located adjacent to, and between, a reference layer (RL) 515 (e.g., a pinned layer) and a free layer (FL) 520 (e.g., formed of CoFeB). A first terminal (T1) 525 and a second terminal (T2) 530 are formed by a first electrode 535 of the MTJ 505. The first electrode 535 is substantially planar and substantially perpendicular to the MTJ's stack. The first electrode 535 is formed of a spin-hall-effect (SHE) material (e.g., Tantalum, Halfnium, Tungsten). A third terminal (T3) 540 is formed by a second electrode 545 of the MTJ 505.

To write a logic one to the MRAM 500, a bias voltage (Vbias) is applied across the MTJ 505 through the first electrode 535 and the second electrode 545. Applying the bias voltage reduces the magnetic anisotropy of the barrier layer 510, which in turn modifies (e.g., reduces) a magnitude of a minimum current required to switch a magnetic state of the free layer 520. While the bias voltage (Vbias) is applied across the MTJ 505, a current is caused to flow from the first terminal (T1) 525 to the second terminal (T2) 530. For example, a write voltage (Vwrite) is applied to the first terminal (T1) 525 while the second terminal (T2) 530 is at a lower voltage, such as ground. The resultant current flow through the first electrode 535 causes spin accumulation on the first electrode's 535 surface in an absence of a magnetic field because the first electrode 535 is formed of a SHE material. Spin current generated by SHE then places the free layer 520 in an antiparallel (AP) magnetic state using spin torque transfer (STT). The antiparallel state results in the MTJ 505 exhibiting relatively high electrical resistance. Thus, the logic one is written to the MRAM 500.

FIG. 5B depicts a write operation in which a logic zero is written to the three-terminal SOT-MRAM 500 having the MTJ 505. To write the logic zero to the MRAM 500, the bias voltage (Vbias) is applied across the MTJ 505 through the first electrode 535 and the second electrode 545. Applying the bias voltage reduces the magnetic anisotropy of the barrier layer 510, which in turn modifies (e.g., reduces) a magnitude of a minimum current required to switch a magnetic state of the free layer 520. While the bias voltage (Vbias) is applied across the MTJ 505, a current is caused to flow from the second terminal (T2) 530 to the first terminal (T1) 525. For example, the write voltage (Vwrite) is applied to the second terminal (T2) 530 while the first terminal (T1) 525 is at a lower voltage, such as ground. The resultant current flow through the first electrode 535 causes spin accumulation on the first electrode's 535 surface in an absence of a magnetic field because the first electrode 535 is formed of a SHE material. Spin current generated by SHE then places the free layer 520 in a parallel (P) magnetic state using STT. The parallel state results in the MTJ 505 exhibiting relatively low electrical resistance. Thus, the logic zero is written to the MRAM 500.

FIG. 5C depicts a read operation 575 in which a state of the three-terminal SOT-MRAM 500 having the MTJ 505 is read. To read the MRAM 500, a read voltage (Vread) is applied across the MTJ 505 through the first electrode 535 and the second electrode 545. While applying the read voltage (Vread), the first terminal (T1) 525 and the second terminal (T2) 530 are held at a lower voltage, such as ground. A magnitude of a resultant current flowing through the MTJ 505 indicates an electrical resistance of the MTJ 505. If the MTJ 505 exhibits relatively low electrical resistance, then the MTJ 505 is in a parallel (P) state, and a logic zero is read. If the MTJ 505 exhibits relatively high electrical resistance, then the MTJ 505 is in an antiparallel (AP) state, and a logic one is read.

Alternatively, a current can be passed through the MTJ 505 between the first electrode 535 and the second electrode 545. Resistance of the MTJ 505 to the current flow develops a voltage drop across the MTJ 505. The voltage drop across the MTJ 505 can be compared to a reference voltage drop across a reference resistance using a sense circuit. The difference between the voltage drop across the MTJ 505 and the reference voltage drop indicates if the MTJ 505 exhibits relatively low electrical resistance or relatively high electrical resistance, which in turn indicates if the MTJ 505 is in a parallel (P) state (i.e., logic zero) or in an antiparallel (AP) state (i.e., logic one).

FIG. 6A depicts an exemplary method for writing data 600 to a three-terminal spin-orbit-torque magnetoresistive memory having an MTJ including a free layer located between an oxide barrier layer and a substantially planar spin hall-effect material. The method for writing data 600 can be performed by the apparatus described hereby, such as the processor 205, controller 382, and a memory controller.

In block 605, a first voltage is applied across the MTJ to reduce a magnetic anisotropy of the free layer by inducing an electric field across the oxide barrier layer. The electric field can be applied in a manner that reduces the magnetic anisotropy of the free layer from a naturally-occurring anisotropy of the free layer. The reducing the magnetic anisotropy of the free layer can reduce a switching current of the MTJ. The applying the first voltage across the MTJ includes applying the voltage between the substantially planar spin hall-effect material and an MTJ electrode.

In block 610, a second voltage is applied across the substantially planar spin hall-effect material to cause a current to flow through the substantially planar spin hall-effect material and thereby apply a spin-orbit torque to the free layer, thus causing the free layer to switch between a parallel state and an antiparallel state.

Figure 6B:
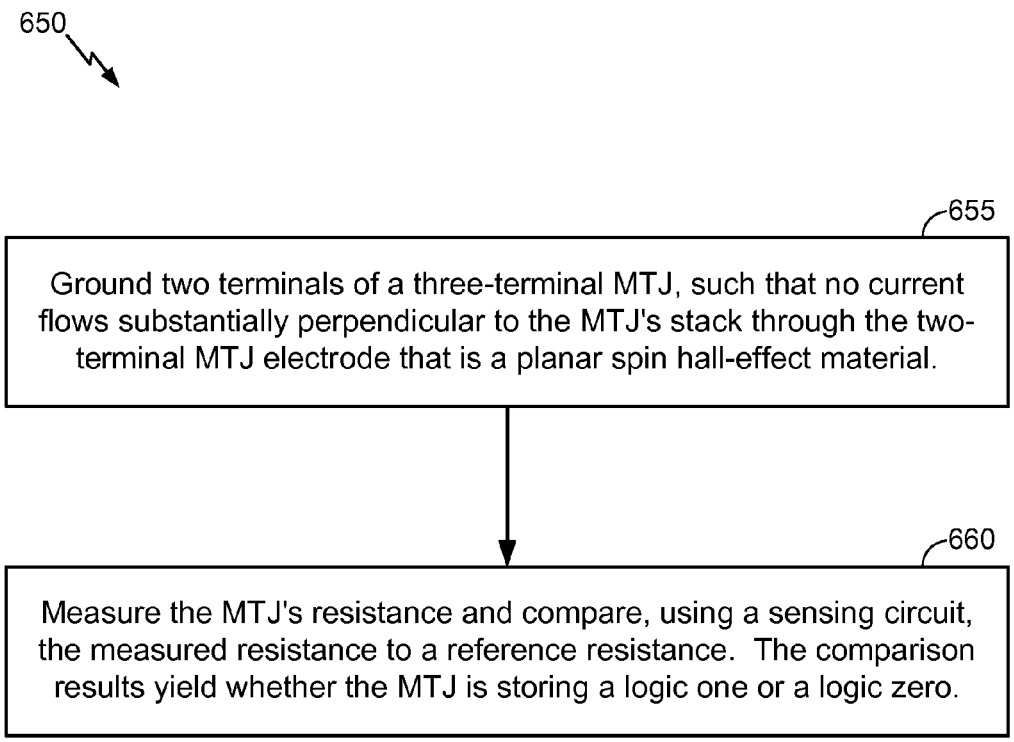
FIG. 6B depicts an exemplary method for reading data from a three-terminal spin-orbit-torque magnetoresistive read only memory.

FIG. 6B depicts an exemplary method for reading data 650 from a three-terminal spin-orbit-torque magnetoresistive read only memory having an MTJ including a magnesium oxide barrier layer adjacent to a free layer. The method for writing data 650 can be performed by the apparatus described hereby, such as the processor 205, controller 382, and a memory controller.

In block 655, two terminals of the MTJ are grounded, such that no current flows substantially perpendicular to the MTJ's stack through the MTJ electrode that is a planar spin hall-effect material.

In block 660, the MTJ's resistance is measured and compared to a reference resistance with a sensing circuit. The comparison results yield whether the MTJ is storing a logic one or a logic zero.

The foregoing blocks are not limiting of the various examples. The blocks can be combined and/or the order can be rearranged.

Further, those of skill in the art will appreciate that the various illustrative logical blocks, modules, circuits, and algorithm blocks described in connection with the examples disclosed herein may be implemented as electronic hardware, computer software, or combinations of both. To clearly illustrate this interchangeability of hardware and software, various illustrative components, blocks, modules, circuits, and blocks have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present examples.

In some aspects, the teachings herein can be employed in a multiple-access system capable of supporting communication with multiple users by sharing the available system resources (e.g., by specifying one or more of bandwidth, transmit power, coding, interleaving, and so on). For example, the teachings herein can be applied to any one or combinations of the following technologies: Code Division Multiple Access (CDMA) systems, Multiple-Carrier CDMA (MCCDMA), Wideband CDMA (W-CDMA), High-Speed Packet Access (HSPA, HSPA+) systems, Time Division Multiple Access (TDMA) systems, Frequency Division Multiple Access (FDMA) systems, Single-Carrier FDMA (SC-FDMA) systems, Orthogonal Frequency Division Multiple Access (OFDMA) systems, or other multiple access techniques. A wireless communication system employing the teachings herein can be designed to implement one or more standards, such as IS-95, cdma2000, IS-856, W-CDMA, TDSCDMA, and other standards. A CDMA network can implement a radio technology such as Universal Terrestrial Radio Access (UTRA), cdma2000, or some other technology. UTRA includes W-CDMA and Low Chip Rate (LCR). The cdma2000 technology covers IS-2000, IS-95 and IS-856 standards. A TDMA network can implement a radio technology such as Global System for Mobile Communications (GSM). An OFDMA network can implement a radio technology such as Evolved UTRA (E-UTRA), IEEE 802.11, IEEE 802.16, IEEE 802.20, Flash-OFDM®, etc. UTRA, E-UTRA, and GSM are part of Universal Mobile Telecommunication System (UMTS). The teachings herein can be implemented in a 3GPP Long Term Evolution (LTE) system, an Ultra-Mobile Broadband (UMB) system, and other types of systems. LTE is a release of UMTS that uses E-UTRA. UTRA, E-UTRA, GSM, UMTS and LTE are described in documents from an organization named "3rd Generation Partnership Project" (3GPP), while cdma2000 is described in documents from an organization named "3rd Generation Partnership Project 2" (3GPP2). Although certain aspects of the disclosure can be described using 3GPP terminology, it is to be understood that the teachings herein can be applied to 3GPP (e.g., Re199, Re15, Re16, Re17) technology, as well as 3GPP2 (e.g., 1×RTT, 1×EV-DO RelO, RevA, RevB) technology and other technologies. The techniques can be used in emerging and future networks and interfaces, including Long Term Evolution (LTE).

At least a portion of the methods, sequences, and/or algorithms described in connection with the examples disclosed herein can be embodied directly in hardware, in software executed by a processor, or in a combination of the two. In an example, a processor includes multiple discrete hardware components. A software module may reside in RAM memory, flash memory, ROM memory, EPROM memory, EEPROM memory, registers, hard disk, a removable disk, a CD-ROM, and/or any other form of storage medium known in the art. An exemplary storage medium (e.g., a memory) can be coupled to the processor such that the processor can read information from, and write information to, the storage medium. In an alternative, the storage medium may be integral with the processor.

Further, many examples are described in terms of sequences of actions to be performed by, for example, elements of a computing device. The actions described herein can be performed by a specific circuit (e.g., an application specific integrated circuit (ASIC)), by program instructions being executed by one or more processors, or by a combination of both. Additionally, a sequence of actions described herein can be considered to be embodied entirely within any form of computer readable storage medium having stored therein a corresponding set of computer instructions that upon execution would cause an associated processor (such as a special-purpose processor) to perform at least a portion of a function described herein. Thus, the various aspects of the examples may be embodied in a number of different forms, all of which have been contemplated to be within the scope of the claimed subject matter. In addition, for each of the examples described herein, a corresponding circuit of any such examples may be described herein as, for example, "logic configured to" perform a described action.

An example can include a computer readable media embodying a method described herein. Accordingly, the teachings are not limited to illustrated examples and any means for performing the functions described herein are included in the teachings.

The disclosed devices and methods can be designed and can be configured into a computer-executable file that is in a Graphic Database System Two (GDSII) compatible format, an Open Artwork System Interchange Standard (OASIS) compatible format, and/or a GERBER (e.g., RS-274D, RS-274X, etc.) compatible format, which are stored on a non-transitory (i.e., a non-transient) computer-readable media. The file can be provided to a fabrication handler who fabricates with a lithographic device, based on the file, an integrated device. Deposition of a material to form at least a portion of a structure described herein can be performed using deposition techniques such as physical vapor deposition (PVD, e.g., sputtering), plasma-enhanced chemical vapor deposition (PECVD), thermal chemical vapor deposition (thermal CVD), and/or spin-coating. Etching of a material to form at least a portion of a structure described herein can be performed using etching techniques such as plasma etching. In an example, the integrated device is on a semiconductor wafer. The semiconductor wafer can be cut into a semiconductor die and packaged into a semiconductor chip. The semiconductor chip can be employed in a device described herein (e.g., a mobile device).

Examples can include a non-transitory (i.e., a non-transient) machine-readable media and/or a non-transitory (i.e., a non-transient) computer-readable media embodying instructions which, when executed by a processor (such as a special-purpose processor), transform a processor and any other cooperating devices into a machine (e.g., a special-purpose processor) configured to perform at least a part of a function described hereby and/or transform a processor and any other cooperating devices into at least a part of the apparatus described hereby.

Nothing stated or illustrated depicted in this application is intended to dedicate any component, step, feature, object, benefit, advantage, or equivalent to the public, regardless of whether the component, step, feature, object, benefit, advantage, or the equivalent is recited in the claims.

While this disclosure describes examples, it should be noted that various changes and modifications could be made herein without departing from the scope of the examples as defined by the appended claims.

What is claimed is:

1. A method for writing data to a three-terminal spin-orbit-torque magnetoresistive memory having a magnetic tunnel junction (MTJ) including a free layer located between an oxide barrier layer and a substantially planar spin hall-effect material, comprising:
    applying a first voltage across the MTJ to reduce a magnetic anisotropy of the free layer by inducing an electric field across the oxide barrier layer and reducing energy barrier for switching the free layer magnetization; and
    applying a second voltage across the substantially planar spin hall-effect material while the first voltage is applied across the MTJ to cause a current to flow through the substantially planar spin hall-effect material and thereby apply a spin-orbit torque to the free layer, thus causing the free layer to switch between a parallel state and an antiparallel state through spin accumulation on a surface of the substantially planar spin hall-effect material.

2. The method of claim 1, wherein the electric field is induced in a manner that reduces the magnetic anisotropy of the free layer from a naturally-occurring anisotropy of the free layer.

3. The method of claim 2, wherein the reduced magnetic anisotropy of the free layer causes a reduction in a switching current of the MTJ.

4. The method of claim 1, wherein the first voltage is applied across the MTJ between the substantially planar spin hall-effect material and an MTJ electrode.

5. An apparatus, comprising:
a memory controller configured to write data to a three-terminal spin-orbit-torque magnetoresistive memory having a magnetic tunnel junction (MTJ) including a free layer located between an oxide barrier layer and a substantially planar spin hall-effect material, including:
means for applying a first voltage across the MTJ to reduce a magnetic anisotropy of the free layer by inducing an electric field across the oxide barrier layer; and
means for applying a second voltage across the substantially planar spin hall-effect material while the first voltage is applied across the MTJ to cause a current to flow through the substantially planar spin hall-effect material and thereby apply a spin-orbit torque to the free layer, thus causing the free layer to switch between a parallel state and an antiparallel state through spin accumulation on a surface of the substantially planar spin hall-effect material.

6. The apparatus of claim 5, wherein the electric field is induced in a manner that reduces the magnetic anisotropy of the free layer from a naturally-occurring anisotropy of the free layer.

7. The apparatus of claim 6, wherein the reduced magnetic anisotropy of the free layer causes a reduction in a switching current of the MTJ.

8. The apparatus of claim 5, wherein the means for applying the first voltage across the MTJ is configured to apply the first voltage between the substantially planar spin hall-effect material and an MTJ electrode.

9. The apparatus of claim 5, wherein at least a part of the means for applying the voltage across the MTJ is integrated on a semiconductor die.

10. The apparatus of claim 5, further comprising at least one of a mobile device, a base station, a terminal, a set top box, a music player, a video player, an entertainment unit, a navigation device, a communications device, a personal digital assistant, a fixed location data unit, or a computer, of which the means for applying the voltage across the MTJ is a constituent part.

11. An apparatus, comprising:
a memory controller configured to write data to a three-terminal spin-orbit-torque magnetoresistive memory having a magnetic tunnel junction (MTJ) including a free layer located between an oxide barrier layer and a substantially planar spin hall-effect material,
wherein the memory controller is configured to apply a first voltage across the MTJ to reduce a magnetic anisotropy of the free layer by inducing an electric field across the oxide barrier layer; and
wherein the memory controller is configured to apply a second voltage across the substantially planar spin hall-effect material while the first voltage is applied across the MTJ to cause a current to flow through the substantially planar spin hall-effect material and thereby apply a spin-orbit torque to the free layer, thus causing the free layer to switch between a parallel state and an antiparallel state through spin accumulation on a surface of the substantially planar spin hall-effect material.

12. The apparatus of claim 11, wherein the memory controller is configured to induce the electric field in a manner that reduces the magnetic anisotropy of the free layer from a naturally-occurring anisotropy of the free layer.

13. The apparatus of claim 12, wherein the reduced magnetic anisotropy of the free layer causes a reduction in a switching current of the MTJ.

14. The apparatus of claim 11, wherein the memory controller is configured to apply the first voltage across the MTJ between the substantially planar spin hall-effect material and an MTJ electrode.

15. The apparatus of claim 11, wherein at least a part of the memory controller is integrated on a semiconductor die.

16. The apparatus of claim 11, further comprising at least one of a base station or a mobile device, with which the memory controller is integrated.

17. The apparatus of claim 11, further comprising at least one of a mobile device, a base station, a terminal, a set top box, a music player, a video player, an entertainment unit, a navigation device, a communications device, a personal digital assistant, a fixed location data unit, or a computer, of which the memory controller is a constituent part.

18. A non-transitory computer-readable medium, comprising:
fabrication device-executable instructions stored thereon configured to cause a fabrication device to fabricate at least a part of an integrated circuit including a memory controller configured to write data to a three-terminal spin-orbit-torque magnetoresistive memory having a magnetic tunnel junction (MTJ) including a free layer located between an oxide barrier layer and a substantially planar spin hall-effect material,
wherein the memory controller is configured to apply a first voltage across the MTJ to reduce a magnetic anisotropy of the free layer by inducing an electric field across the oxide barrier layer; and
wherein the memory controller is configured to apply a second voltage across the substantially planar spin hall-effect material while the first voltage is applied across the MTJ to cause a current to flow through the substantially planar spin hall-effect material and thereby apply a spin-orbit torque to the free layer, thus causing the free layer to switch between a parallel state and an antiparallel state through spin accumulation on a surface of the substantially planar spin hall-effect material.

19. The non-transitory computer-readable medium of claim 18, wherein the memory controller is configured to induce the electric field in a manner that reduces the magnetic anisotropy of the free layer from a naturally-occurring anisotropy of the free layer.

20. The non-transitory computer-readable medium of claim 19, wherein the reduced magnetic anisotropy of the free layer causes a reduction in a switching current of the MTJ.

21. The non-transitory computer-readable medium of claim 18, wherein the memory controller is configured to apply the first voltage across the MTJ between the substantially planar spin hall-effect material and an MTJ electrode.

* * * * *